(12) United States Patent  
Chang (10) Patent No.: US 8,115,215 B2  
(45) Date of Patent: Feb. 14, 2012

(54) ARRAY SUBSTRATE AND METHOD FOR MANUFACTURING THE SAME

(75) Inventor: Chun-Huan Chang, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 860 days.

(21) Appl. No.: 12/078,902

(22) Filed: Apr. 8, 2008

(65) Prior Publication Data

US 2008/0251797 A1    Oct. 16, 2008

(30) Foreign Application Priority Data

Apr. 10, 2007   (TW) ................ 96112475 A  
Jan. 3, 2008    (TW) ................ 97100162 A (51) Int. Cl.  
*H01L 29/18* (2006.01)

(52) U.S. Cl. ............. 257/88; 257/195; 257/72; 349/39; 438/267; 438/587

(58) Field of Classification Search ............ 257/72, 257/195, 88; 349/39; 438/267, 587  
See application file for complete search history.

(56) References Cited

U.S. PATENT DOCUMENTS

2004/0169991 A1*   9/2004  Nagata et al. ............. 361/301.1

FOREIGN PATENT DOCUMENTS

TW           591315 B       6/2004

* cited by examiner

*Primary Examiner* — Kenneth Parker  
*Assistant Examiner* — Dale E Page  
(74) *Attorney, Agent, or Firm* — Bacon & Thomas, PLLC (57) ABSTRACT

An array substrate is disclosed. The array substrate comprises a substrate, a gate metal layer, a gate insulation layer, a semiconductor layer, a patterned metal layer, a flat layer, and a pixel electrode. The patterned metal layer is disposed on the surface of the semiconductor layer comprising a source and a drain, and on the surface of the gate insulation layer comprising a storage capacitor line and a data line. The storage capacitor line has an extending portion parallel to a scan line. The pixel electrode overlaps parts of the scan line, parts of the data line, parts of the storage capacitor line, and parts of the extending portion. A method for manufacturing the array substrate is also provided.

20 Claims, 8 Drawing Sheets

ARRAY SUBSTRATE AND METHOD FOR MANUFACTURING THE SAME

BACKGROUND OF THE INVENTION

1. Field of the Invention

The present invention relates to an array substrate and a method for manufacturing the same, and more particularly, to an array substrate and a method for manufacturing the same in order to reduce flickers of frames.

2. Description of Related Art

Cathode ray tube televisions are now virtually obsolete due to their bulkiness and have been replaced by thin and light display devices, such as liquid crystal displays (LCDs). Among LCDs, thin film transistor liquid crystal displays (TFT-LCDs) are of particular interest to R&D in this field.

In TFT-LCDs, the response rate of liquid crystal (LC) is one of directions for study. In this kind of LCDs, each pixel is electrically connected with a TFT as a switch element. In a determined period, the TFT inputs electricity required for the pixel, and the input electricity is maintained until the next input of electricity required for the next scanning. Generally, the capacitance of the LC is not large. It is difficult to maintain original input electricity only by the capacitance of the LC until the next input of electricity required for the next scanning. Hence, a storage capacitor (Cs) is required to connect with the TFT of the pixel in parallel so as to increase the capacitance maintaining the electricity. In general, the Cs is disposed on the gate or on the common electrode.

Figure 1:
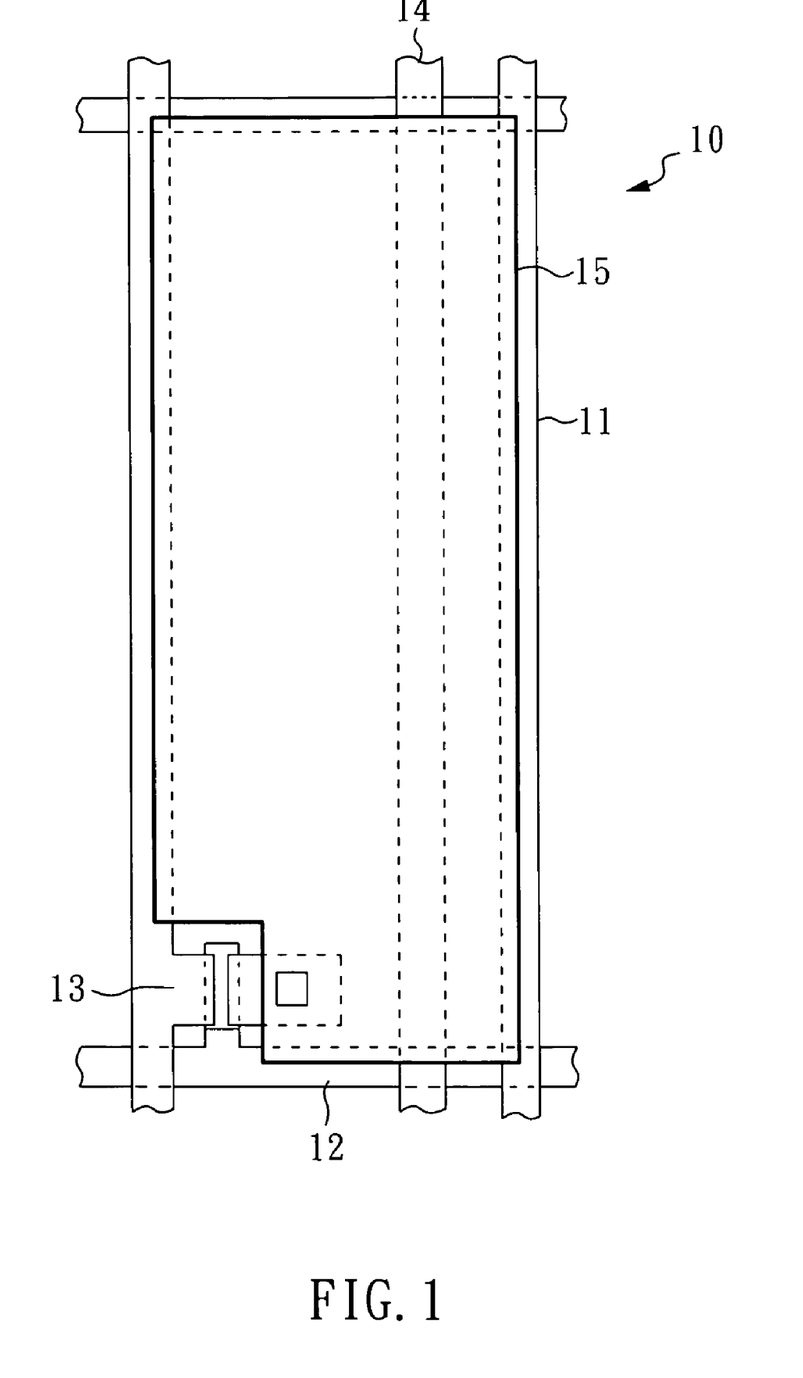
FIG. 1 is a top view of a pixel according to a conventional liquid crystal display panel.

However, the above-mentioned parallel disposition of the storage capacitor line and the gate electrode line results in a crosstalk effect generated by the data line due to the storage capacitor line. Therefore, there is a layout of the storage capacitor line and the data line disposed in parallel to reduce the crosstalk effect. As shown in FIG. 1, a pixel 10 is enclosed by two neighbor data lines 11 and two neighbor scan lines 12, and has a TFT 13 serving as a switch element. Near the switch element, the data line 11 is interlaced with the scan line 12. A storage capacitor line 14 is disposed in parallel to the data line 11, and is used for formation and connection of storage capacitance of every pixel 10. A pixel electrode 15 crosses over two data lines 11 and two scan lines 12. However, in the LCDs having the storage capacitor lines 14 in parallel to the data lines 11, while the TFT 13 is turned off, a kickback voltage (ΔVp) toward the pixel electrode 15 is generated by the scan line 12 due to a parasitic capacitance. An equation is as follows:

$$\Delta Vp = (Vgh - Vgl)\frac{Cgd}{Clc + Ccs + Cgd}$$

wherein Vgh is a voltage of turning on the gate; Vgl is a voltage of turning off the gate; Clc is a capacitance of the LC; Ccs is a storage capacitance; and Cgd is a parasitic capacitance. If the parasitic capacitance is large, the kickback voltage (ΔVp) is large. Due to the kickback voltage (ΔVp), a feedthrough voltage under polar changes of the pixel electrode results in the flickers of a frame.

SUMMARY OF THE INVENTION

In view of the above-mentioned shortcomings, one aspect of the present invention is directed to an array substrate comprising a substrate, a gate metal layer, a gate insulation layer, a semiconductor layer, a patterned metal layer, a flat layer, and a pixel electrode. In the array substrate, the gate metal layer is disposed on the surface of the substrate, and serves as a gate and a scan line. The gate insulation layer is disposed on the substrate, and covers the gate metal layer. In addition, the semiconductor layer is disposed on the surface of the gate insulation layer and over the gate. The patterned metal layer is disposed on the surface of the semiconductor layer comprising a source and a drain, and on the surface of the gate insulation layer comprising a storage capacitor line and a data line. The storage capacitor line is parallel to the data line, and the storage capacitor line has an extending portion parallel to the scan line. Furthermore, the flat layer covers over the substrate. The pixel electrode is disposed on the surface of the flat layer, which conducted with the drain, and overlapping parts of the scan line, parts of the data line, parts of the storage capacitor line, and parts of the extending portion.

The array substrate may comprise an ohmic contact layer corresponding to two sides of the gate. The ohmic contact layer is disposed between the semiconductor layer and the patterned metal layer. Additionally, the ohmic contact layer may be made of materials such as $N^+$—Si.

The array substrate may comprise a protection layer disposed on the surfaces of the gate insulation layer and the patterned metal layer.

In the array substrate, the pixel electrode may cover the storage capacitor line. The extending portion of the storage capacitor line may substantially align with the border of the pixel electrode, or may overlap the pixel electrode. The pixel electrode may be an indium tin oxide (ITO) electrode or an indium zinc oxide (IZO) electrode. The array substrate may comprise a transparent electrode layer disposed between the ohmic contact layer and the metal layer. The transparent electrode layer is connected with the pixel electrode. The transparent electrode layer may be made of ITO or IZO.

Another aspect of the present invention is directed to a method for manufacturing an array substrate. The method comprises providing a substrate; forming a gate metal layer on the substrate, and the gate metal layer serving as a gate and a scan line; forming a gate insulation layer to cover the gate metal layer; forming a semiconductor layer on the surface of the gate insulation layer corresponding to the gate; forming a patterned metal layer on the surface of the semiconductor layer comprising a source and a drain separated from each other, and on the surface of the gate insulation layer comprising a storage capacitor line and a data line; forming a patterned flat layer over the substrate to cover the patterned metal layer, the gate insulation layer, and the semiconductor layer; and forming a pixel electrode on the surface of the flat layer to overlap parts of the scan line, parts of the data line, parts of the storage capacitor line, and parts of the extending portion. The storage capacitor line is parallel to the data line, and has an extending portion parallel to the scan line. The pixel electrode is conducted with the drain.

Hence, the storage capacitor line, applied in the present invention, extends to the overlap region of the pixel electrode and the scan line, so that the storage capacitance produced thereby may cover part of a parasitic capacitance. While the TFT is turned off, a generated kickback voltage toward the pixel electrode is reduced due to the above. Therefore, when the pixel electrode is performed with polar changes in the same gray-scale frame, the present invention can provide a solution to reduce flickers of the frame resulting from a feedthrough voltage in prior arts.

Other objects, advantages, and novel features of the invention will become more apparent from the following detailed description when taken in conjunction with the accompanying drawings.

DETAILED DESCRIPTION OF THE PREFERRED EMBODIMENT

By the following specific embodiment, the present invention is put into practice. One skilled in the art can easily understand other advantages and efficiency of the present invention through the disclosed content of the specification. Through other different embodiments, the present invention can be carried out or applied. According to different observations and applications, all details of the specification can be modified and changed as not going against the spirit of the present invention.

Embodiment 1

Figure 2:
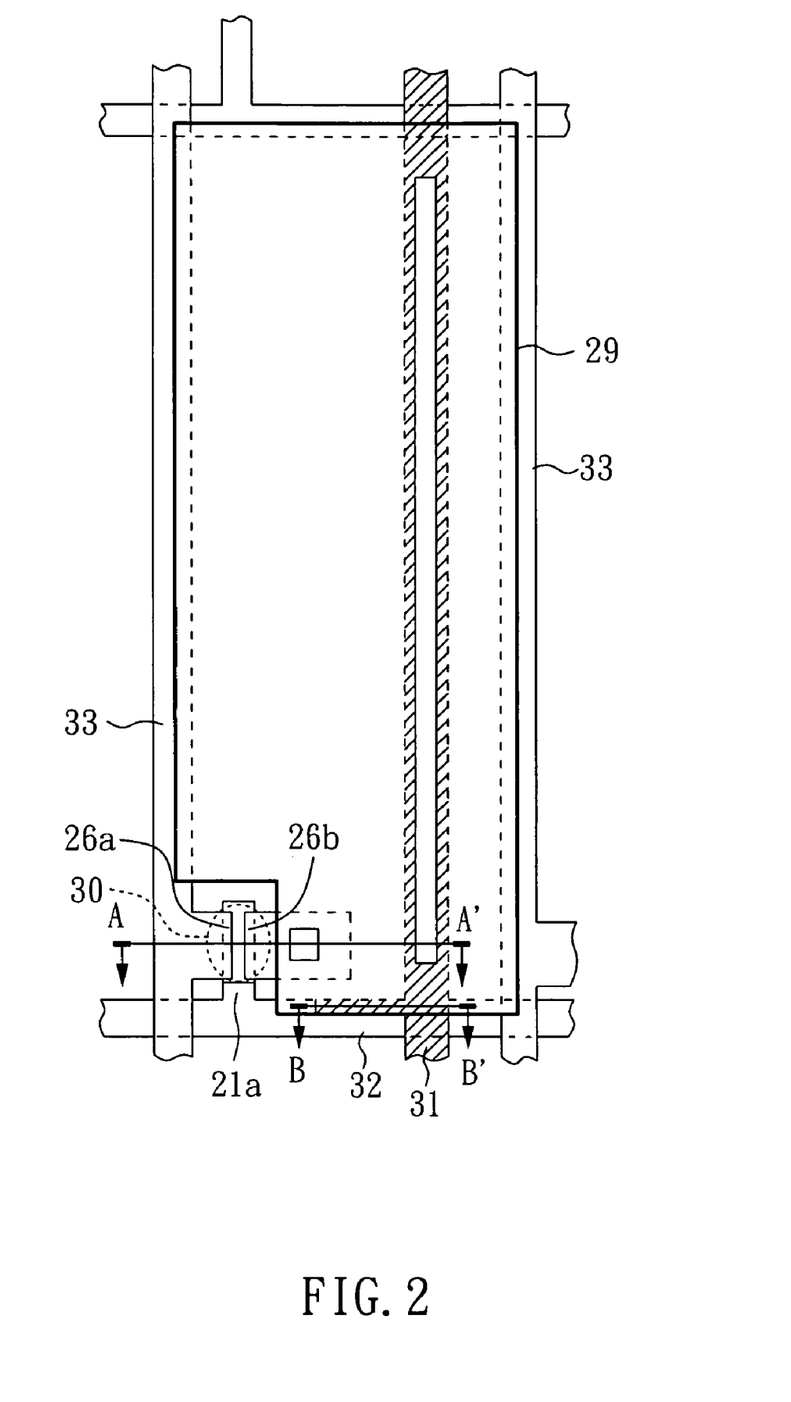
FIG. 2 is a top view of an array substrate pixel in a preferred embodiment of the present invention.

FIG. 2 is a top view of a partial array substrate of the first embodiment of the invention. The array substrate comprises a pixel electrode 29, a TFT 30, and a storage capacitor line 31. The pixel electrode 29 is disposed over a pixel enclosed by two neighbor scan lines 32 and two neighbor data lines 33. Besides, the TFT 30 comprises a source 26a, a drain 26b, and a gate 21a. The source 26a, the drain 26b, and the gate 21a are respectively connected with the data line 33, the pixel electrode 29, and the scan line 32. The storage capacitor line 31 is disposed in parallel with the data line 33. Additionally, the storage capacitor line 31 has an extending portion between the scan line 32 and the pixel electrode 29, i.e. the extending portion is parallel to the scan line 32. The storage capacitor line 31 and the data line 33 are simultaneously formed by being patterned.

Illustrating the present embodiment in more detail, as shown in FIGS. 3A to 3G, there is a flow chart of the AA' line in the FIG. 2 for manufacturing an array substrate pixel. Besides, as shown in FIGS. 4A to 4F, there is a flow chart of the BB' line in the FIG. 2 for manufacturing an array substrate pixel.

Figure 3A:
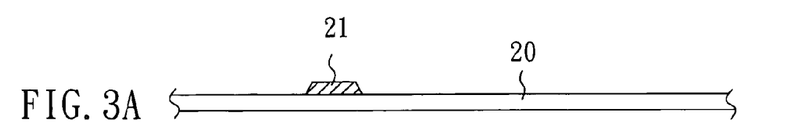
FIGS. 3A to 3G show sectional views taken along line AA' as shown in FIG. 2 for manufacturing an array substrate pixel according to one embodiment of the present invention.
Figure 4A:
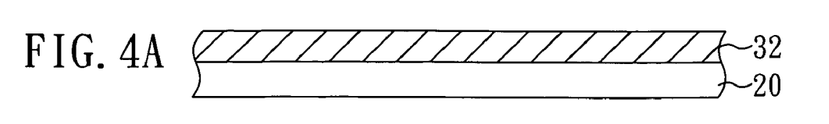
FIGS. 4A to 4F show sectional views taken along line BB' as shown in FIG. 2 for manufacturing an array substrate pixel according to one embodiment of the present invention.

With reference to FIGS. 3A and 4A, a glass substrate 20 is provided. Then, a gate metal layer 21 is formed by photolithography and etching on the surface of the glass substrate 20. The gate metal layer 21 is formed as the gate 21a in the TFT 30 and the scan line 32 in FIG. 4A. As shown in FIG. 2, the TFT 30 mainly serves as a switch element.

Figure 3B:
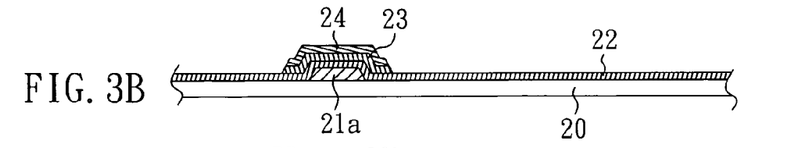
Figure 4B:
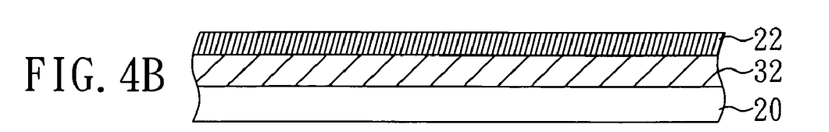
Figure 4C:
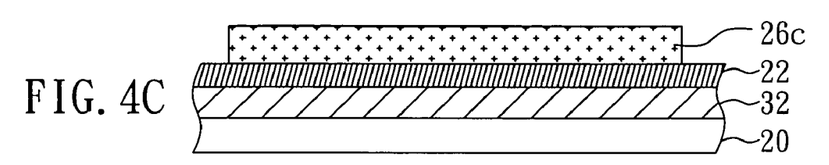

With reference to FIGS. 3B and 4B, a gate insulation layer 22 is formed on the surface of the glass substrate 20 having the gate metal layer 21 thereon. Then, a semiconductor layer 23 and an ohmic contact layer 24 are in sequence deposited and then patterned on the region corresponding to the gate 21a.

Figure 3C:
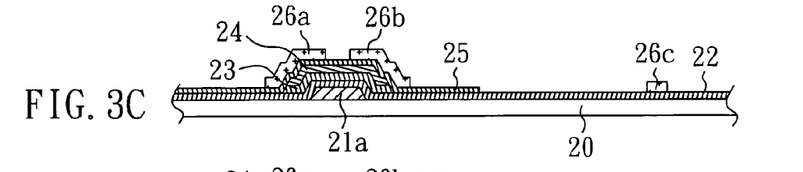

Subsequently, as shown in FIG. 3C, a transparent electrode layer 25 is formed by being patterned. The transparent electrode layer 25 may be made of ITO or IZO, but the invention is not limited the above materials and can be revised based on practical requirements. Then, patterned metal layers 26a, 26b, and 26c are formed on the surface of the structure shown in FIGS. 3C and 4C. The patterned metal layers 26a and 26b are separated by a gap corresponding to the gate 21a, and they respectively serve as a source 26a and a drain 26b. In addition, the source 26a is connected with the data line 33 (in FIG. 2); the drain 26b is connected with the pixel electrode 29 (in FIG. 2); the metal layer 26c is disposed on the surface of the gate insulation layer 22, and serves as the storage capacitor line 31 and the data line 33 (in FIG. 2). Moreover, the metal layer 26c serving as the storage capacitor line 31 extends to a region over the scan line 32, and the extending part of the metal layer 26c is the extending portion of the storage capacitor line 31.

Figures 3D, 3E:
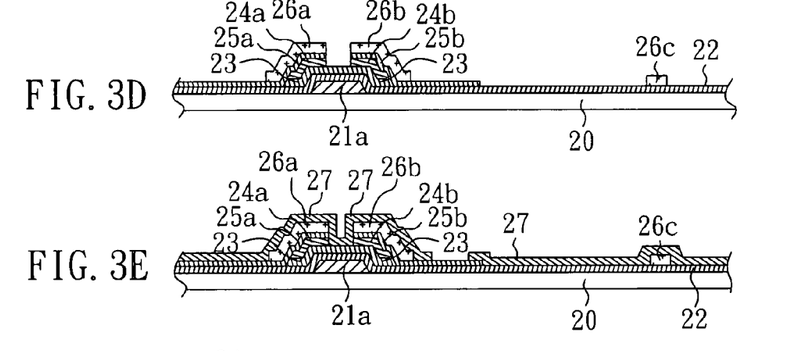

In FIG. 3D, the ohmic contact layer 24 and the transparent electrode layer 25 revealed by the gap between the source 26a and the drain 26b are etched. The formed transparent electrode layers 25a and 25b can serve as connective channels, and the formed ohmic contact layers 24a and 24b are mainly used as interface layers to enhance adhesion and conductivity of the source 26a and the drain 26b.

Figure 4D:
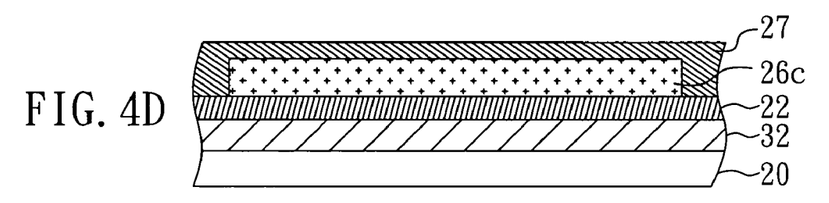

As shown in FIGS. 3E and 4D, a protection layer 27 is formed on the surface of the structure, and then the protection layer 27 is patterned to expose part of the transparent electrode layer 25b (in FIG. 3E). The protection layer 27 can be used to protect the semiconductor layer 23.

Figure 3F:
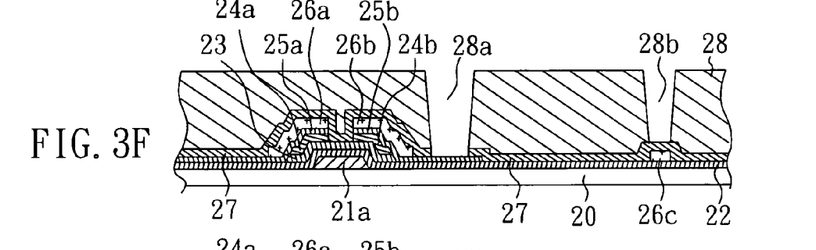
Figure 4E:
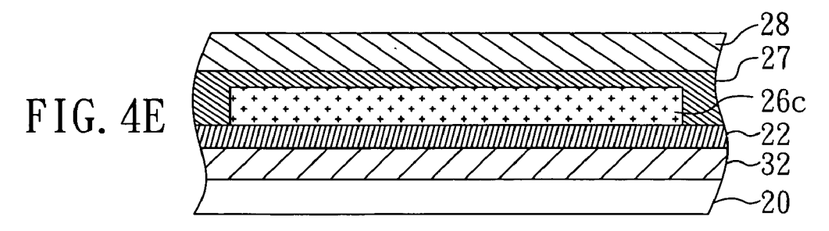

With reference to FIG. 3F, a flat layer 28 is formed on the surface of the structure, and then the flat layer 28 is patterned to form a first contact window 28a and a second contact window 28b respectively on a region exposing part of the transparent electrode layer 25b and on another region corresponding to part of the storage capacitor line 31 (in FIG. 2). The flat layer 28 of the present embodiment may be made of any material such as organic materials, inorganic materials, or multilayer structures. As long as a material has enough thickness for planarization effect, it may serve as the flat layer. The thickness of the flat layer 28 in the present embodiment is about 25000 to 35000 Å. After patterning the flat layer 28, the first contact window 28a is formed to correspond to the exposed part of the transparent electrode layer 25b, and is mainly used to be a connector between the drain 26b and the pixel electrode 29 produced by the subsequent step. The second contact window 28b is used for formation a storage capacitor. Furthermore, as shown in FIG. 4E, the flat layer 28 is also disposed over the scan line 32 corresponding to the BB' line.

Figure 3G:
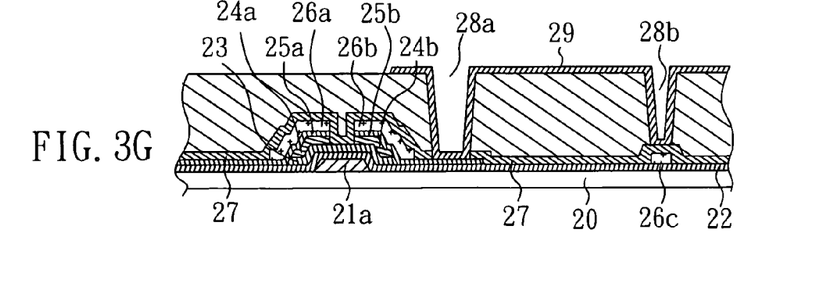
Figure 4F:
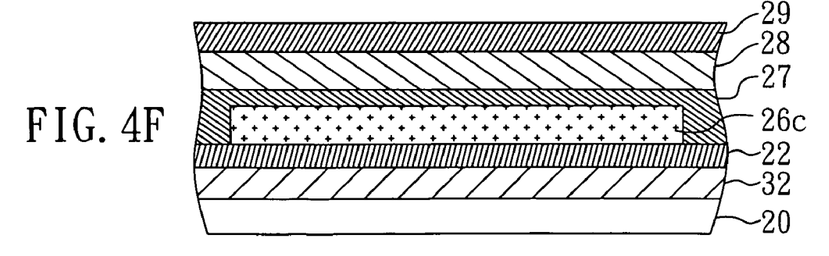

Finally, with reference to FIGS. 3G and 4F, the pixel electrode 29 is formed on the surface of the above-mentioned structure. The pixel electrode 29 is a transparent electrode, and may be made of ITO or IZO, but the invention is not limited the above materials and can be revised based on practical requirements. As shown in FIG. 2, parts of the scan line 32 and the data line 33 are covered by the pixel electrode 29. The pixel electrode 29 deposited on the revealed transparent electrode layer 25b (i.e. the first contact window 28a) is conducted with the drain 26b. Besides, the metal layer 26c, the protection layer 27, and the pixel electrode 29 in the second contact window 28b can be formed as a capacitor to store capacitance. The metal layer 26c is parallel to the data line 33, and extends to a region between the scan line 32 and the pixel electrode 29. Consequently, the array substrate of the present invention is completed.

Furthermore, when the gate 21a is applied with a high voltage, the electricity is perceived by the semiconductor layer 23, and turns on the TFT in a broken circuit. Then, the drain 26b is applied with a low voltage so that more and more electrons are attracted into a channel. Since the electrons produced from the source 26a are pushed by the voltage and flow to the drain 26b (i.e. the corresponding current from the drain 26b flows to the source 26a). If the gate 21a is applied with a negative voltage, the electron flow and the current are in contrast to the above. Therefore, the TFT can be used as a switch element. The semiconductor layer 23 can preferably be made of amorphous silicon, and the ohmic contact layer 24 can preferably be made of materials such as $N^+$—Si, but not limited thereto.

Embodiment 2

Figure 5:
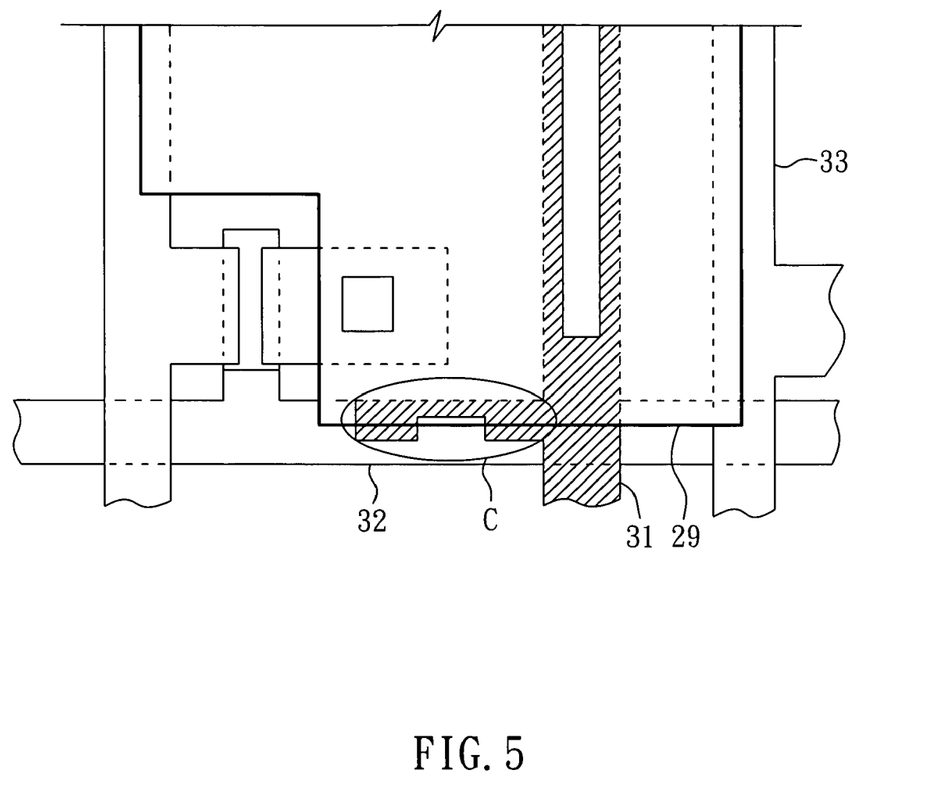
FIG. 5 is a top view of an enlargement of part of an array substrate pixel according to an embodiment of the present invention.

With reference to FIG. 5, there is shown a top view of partial enlargement of an array substrate in the present embodiment. The method for manufacturing the array substrate in the present embodiment is similar to Embodiment 1. The extending portion of storage capacitor line 31 in Embodiment 1 is over part of the scan line 32, but does not extend over the border of the pixel electrode 29. However, in the present embodiment, when forming the metal layers 26a, 26b, and 26c (in FIG. 3C), the extending portion of the storage capacitor line 31 is formed to have a fillister overlapping the pixel electrode 29 in the C region of FIG. 5. Except for the above, other steps in the present embodiment are all the same with those in Embodiment 1. The reason for forming the fillister of the storage capacitor line 31 to overlap the pixel electrode 29 is illustrated as follows. When manufacturing the array substrate, alignment deviations come into existence between layers. The capacitance variation is resulted from the pixel electrode 29 (i.e. the ITO electrode) shifting upwards or downwards while the pixel electrode 29 is exposed. Therefore, the fillister of the storage capacitor line 31 can cause the capacitance variation to be limited therein, so as to reduce the capacitance variation, i.e. to decrease the effect of exposure. Finally, the array substrate of the present embodiment is completed. In other words, the capacitance variation is resulted from the pixel electrode shifting while the pixel electrode is exposed. If the area of the capacitance variation is limited in the fillister, so as to reduce the capacitance variation, and also can increases the stability.

Embodiment 3

Figure 6A:
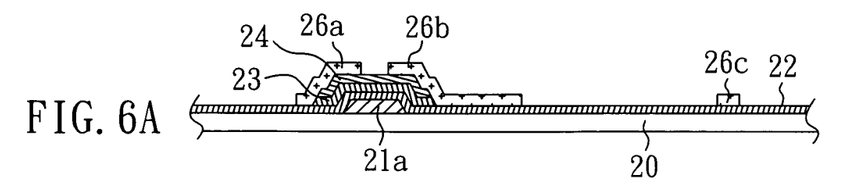
FIGS. 6A to 6C show sectional views taken along line AA' as shown in FIG. 2 for manufacturing an array substrate pixel according to another preferred embodiment of the present invention.
Figure 6B:
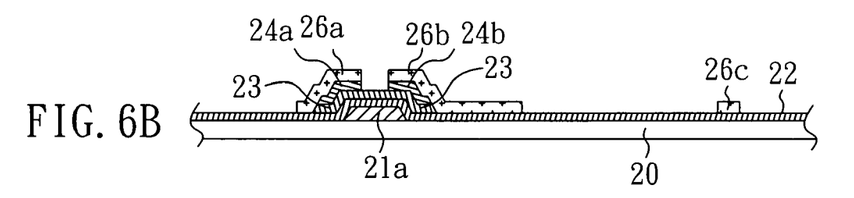
Figure 6C:
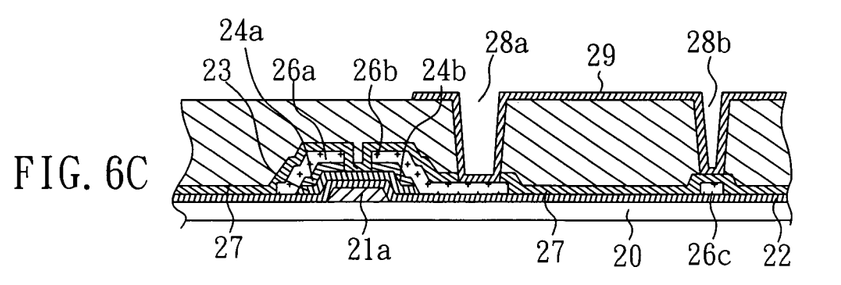

With reference to FIGS. 6A to 6C, another method for manufacturing an array substrate of the present embodiment is provided. The method in the present embodiment is similar to Embodiment 1. However, as shown in FIG. 6A, the array substrate of the present embodiment does not comprise the transparent electrode layer 25 (FIG. 3C).

Subsequently, as shown in FIG. 6B, the ohmic contact layer 24 is etched. The following steps of the present embodiment are the same with those of Embodiment 1. Finally, the array substrate structure as shown in FIG. 6C is formed, in which the pixel electrode 29 is connected with the metal layer 26b.

Embodiment 4

Figure 7A:
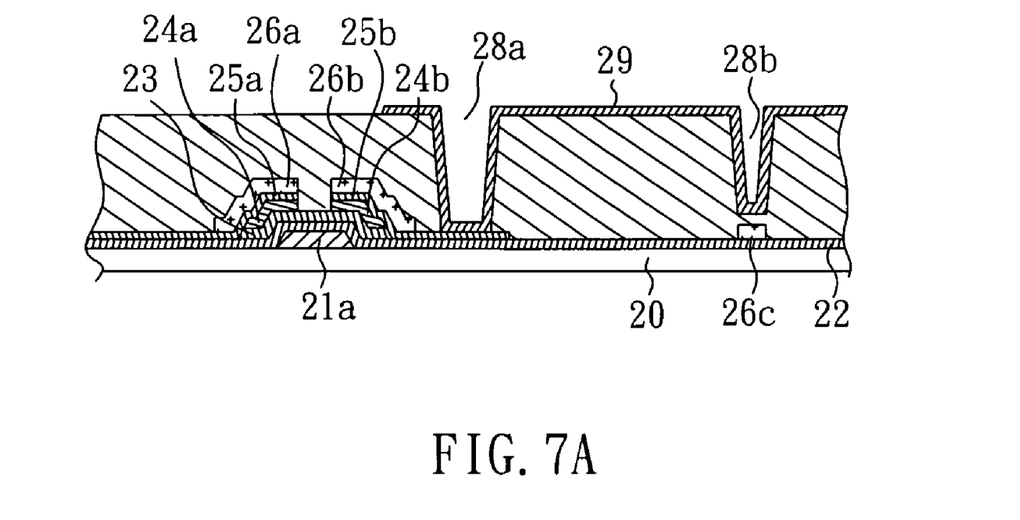
FIG. 7A shows a sectional view taken along line AA' as shown in FIG. 2 for manufacturing an array substrate pixel according to another preferred embodiment of the present invention.
Figure 7B:
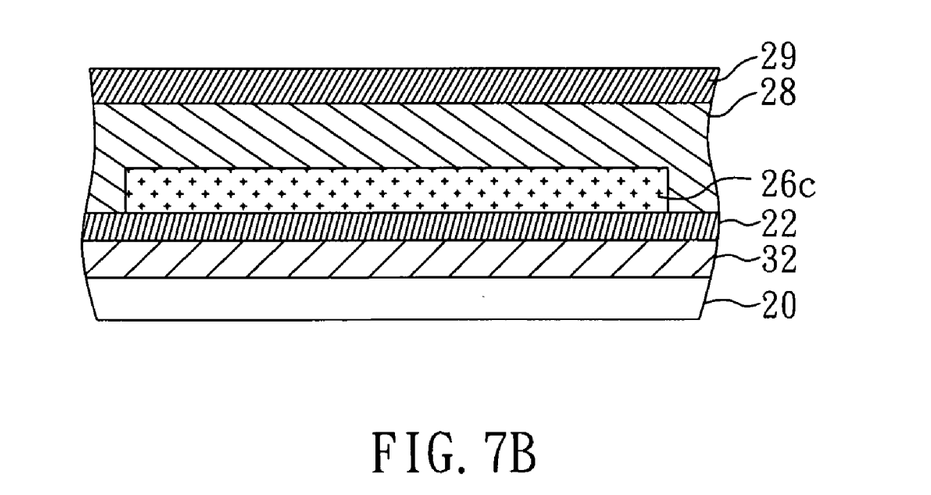
FIG. 7B shows a sectional view taken along line BB' as shown in FIG. 2.

With reference to FIGS. 7A to 7B, there are sectional views respectively in the AA' line of FIG. 2 and in the BB' line of FIG. 2. Another method for manufacturing an array substrate is provided. The method in the present embodiment is similar to Embodiment 1. However, in the present embodiment, the protection layer 27 in FIG. 3E is not formed. Except for the above, other steps of the present embodiment are the same with those in Embodiment 1. Besides, the second contact window 28b is formed as a ditch by halftone process and the flat layer 28 still covers the metal layer 26c. Finally, the array substrate is completed as shown in FIGS. 7A and 7B.

Embodiment 5

Figure 8:
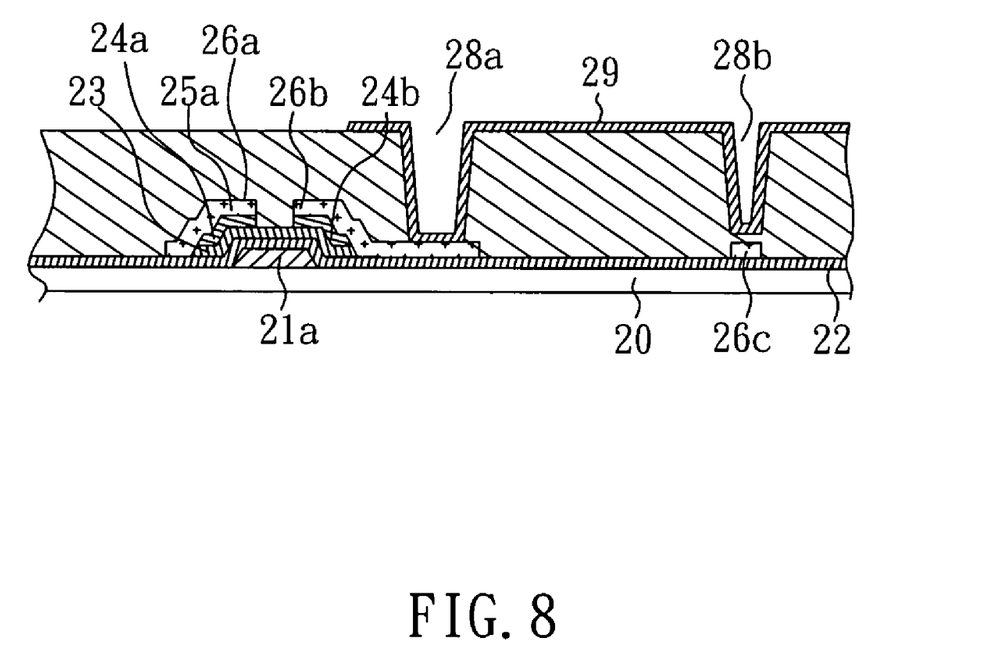
FIG. 8 shows a sectional view taken along line AA' as shown in FIG. 2 for manufacturing an array substrate pixel according to another preferred embodiment of the present invention.

With reference to FIG. 8, another method for manufacturing an array substrate is also provided. The method in the present embodiment is similar to Embodiment 3. However, in the present embodiment, the array substrate of the present embodiment does not comprise the protection layer 27 in FIG. 6C. Besides, the second contact window 28b is formed as a ditch by halftone process and the flat layer 28 still covers the metal layer 26c. Moreover, in the embodiment, the sectional view in the BB' line of FIG. 2 is as shown in FIG. 7B (i.e. Embodiment 4). Finally, the array substrate is completed as shown in FIG. 8.

Consequently, in the present invention, the storage capacitor line is parallel to the data line, and the storage capacitor line has the extending portion corresponding to the region between the scan line and the pixel electrode on the array substrate. In other words, the extending portion is parallel to the scan line. Therefore, the generated kickback voltage toward the pixel electrode due to the parasitic capacitance is decreased so as to reduce flickers of the frame.

Although the present invention has been explained in relation to its preferred embodiments, it is to be understood that many other possible modifications and variations can be made without departing from the scope of the invention as hereinafter claimed.

What is claimed is:
1. An array substrate comprising:
a substrate;
a gate metal layer disposed on the surface of the substrate and serving as a gate and a scan line;
a gate insulation layer disposed on the substrate and covering on the gate metal layer;
a semiconductor layer disposed on the surface of the gate insulation layer and over the gate;
a patterned metal layer disposed on the surface of the semiconductor layer and the surface of the gate insulation layer, wherein the patterned metal layer formed on the surface of the semiconductor layer comprises a source and a drain, the patterned metal layer formed on the surface of the gate insulation layer comprises a storage capacitor line and a data line, and the storage capacitor line has a main portion and an extending portion substantially perpendicular to the main portion, wherein the main portion is substantially parallel to the data line and the extending portion is substantially parallel to the scan line;
a flat layer covering over the substrate;

and a pixel electrode disposed on the surface of the flat layer, which connects with the drain, and overlapping parts of the scan line, parts of the data line, parts of the storage capacitor line, and parts of the extending portion.

2. The array substrate as claimed in claim 1, further comprising an ohmic contact layer corresponding to two sides of the gate and disposed between the semiconductor layer and the patterned metal layer.

3. The array substrate as claimed in claim 2, wherein the ohmic contact layer is made of $N^+$—Si.

4. The array substrate as claimed in claim 1, further comprising a protection layer disposed on the surfaces of the gate insulation layer and the patterned metal layer.

5. The array substrate as claimed in claim 1, wherein the pixel electrode covers on the storage capacitor line.

6. The array substrate as claimed in claim 1, wherein the extending portion of the storage capacitor line substantially aligns with the border of the pixel electrode.

7. The array substrate as claimed in claim 1, wherein the extending portion of the storage capacitor line overlaps the pixel electrode.

8. The array substrate as claimed in claim 1, wherein the pixel electrode is an indium tin oxide (ITO) electrode or an indium zinc oxide (IZO) electrode.

9. The array substrate as claimed in claim 2, further comprising a transparent electrode layer disposed between the ohmic contact layer and the metal layer, wherein the transparent electrode layer is connected with the pixel electrode.

10. The array substrate as claimed in claim 9, wherein the transparent electrode layer is made of ITO or IZO.

11. A method for manufacturing an array substrate comprising the following steps:

Providing a substrate;

Forming a gate metal layer on the substrate, wherein the gate metal layer serves as a gate and a scan line;

Forming a gate insulation layer on the substrate to covering the gate metal layer;

Forming a semiconductor layer on the surface of the gate insulation layer corresponding to the gate;

Forming a patterned metal layer on the surface of the semiconductor layer and the surface of the gate insulation layer, wherein the patterned metal layer formed on the surface of the semiconductor layer comprises a source and a drain, the patterned metal layer formed on the surface of the gate insulation layer comprises a storage capacitor line and a data line, wherein the storage capacitor has a main portion and an extending portion substantially perpendicular to the main portion, wherein the main portion is substantially parallel to the data line and the extending portion is substantially parallel to the scan line;

Forming a patterned flat layer over the substrate to cover the patterned metal layer, the gate insulation layer, and the semiconductor layer; and Forming a pixel electrode on the surface of the flat layer to overlap parts of the scan line, parts of the data line, parts of the storage capacitor line and parts of the extending portion wherein the pixel electrode connects with the drain.

12. The method as claimed in claim 11, further comprising forming an ohmic contact layer corresponding to two sides of the gate to be disposed between the semiconductor layer and the patterned metal layer.

13. The method as claimed in claim 11, further comprising forming a protection layer disposed on the surfaces of the gate insulation layer and the patterned metal layer.

14. The method as claimed in claim 11, wherein the pixel electrode covers on the storage capacitor line.

15. The method as claimed in claim 11, wherein the extending portion of the storage capacitor line substantially aligns with the border of the pixel electrode.

16. The method as claimed in claim 11, wherein the extending portion of the storage capacitor line overlaps the pixel electrode.

17. The method as claimed in claim 11, wherein the pixel electrode is made of ITO or IZO.

18. The method as claimed in claim 11, wherein the semiconductor layer is an amorphous silicon layer.

19. The method as claimed in claim 12, further comprising forming a transparent electrode layer between the ohmic contact layer and the metal layer, and the transparent electrode layer is connected with the pixel electrode.

20. The method as claimed in claim 19, wherein the transparent electrode layer is made of ITO or IZO.

* * * * *